(12) United States Patent
Doxsee et al.

(10) Patent No.: US 6,936,857 B2
(45) Date of Patent: Aug. 30, 2005

(54) WHITE LIGHT LED DEVICE

(75) Inventors: Daniel Darcy Doxsee, Sagamore Hills, OH (US); Anant Achyut Setlur, Niskayuna, NY (US); Zena R. Brown, Beachwood, OH (US); Alok Srivastava, Niskayuna, NY (US); Holly Comanzo, Niskayuna, NY (US)

(73) Assignees: GELcore, LLC, Valley View, OH (US); General Electric Company, Schenectady, NY (US)

( * ) Notice: Subject to any disclaimer, the term of this patent is extended or adjusted under 35 U.S.C. 154(b) by 42 days.

(21) Appl. No.: 10/368,115

(22) Filed: Feb. 18, 2003

(65) Prior Publication Data

US 2004/0159846 A1 Aug. 19, 2004

(51) Int. Cl.⁷ .................. H01L 33/00; H01L 29/82; H01J 1/62; H01J 63/04
(52) U.S. Cl. ............... 257/89; 257/98; 257/99; 257/252; 313/503; 313/502; 313/504; 313/512
(58) Field of Search .............. 257/89, 98, 99, 257/252; 313/502, 503, 504, 512; 349/69; 252/301.4 R

(56) References Cited

U.S. PATENT DOCUMENTS

| | | | |
|---|---|---|---|
| 5,813,753 A | * | 9/1998 | Vriens et al. ............ 362/293 |
| 5,851,963 A | | 12/1998 | Doughty et al. |
| 5,959,316 A | | 9/1999 | Lowery |
| 5,962,971 A | | 10/1999 | Chen |
| 6,252,254 B1 | | 6/2001 | Soules et al. |
| 6,255,670 B1 | | 7/2001 | Srivastava et al. |
| 6,278,135 B1 | | 8/2001 | Srivastava et al. |
| 6,294,800 B1 | | 9/2001 | Duggal et al. |
| 6,319,425 B1 | | 11/2001 | Tasaki et al. |
| 6,409,938 B1 | | 6/2002 | Comanzo |
| 6,596,195 B2 | * | 7/2003 | Srivastava et al. ..... 252/301.4 R |
| 2003/0030060 A1 | | 2/2003 | Okazaki |

FOREIGN PATENT DOCUMENTS

| | | |
|---|---|---|
| EP | 1 138 747 A2 | 4/2001 |
| EP | 1 139 440 A2 | 4/2001 |
| WO | WO 00/33389 | 8/2000 |
| WO | WO 01/89000 A1 | 11/2001 |

* cited by examiner

Primary Examiner—Eddie Lee
Assistant Examiner—Samuel A. Gebremariam
(74) Attorney, Agent, or Firm—Fay, Sharpe, Fagan, Minnich & McKee, LLP

(57) ABSTRACT

A light source including a specific LED and phosphor combination capable of emitting white light for direct illumination. In one embodiment, the light source includes an LED chip emitting in the 460–470 nm range radiationally coupled to a phosphor comprising $Ca_8Mg(SiO_4)_4Cl_2:Eu^{2+}, Mn^{2+}$. In a second embodiment, the light source includes an LED chip emitting at about 430 nm and a phosphor comprising a blend of $Sr_4Al_{14}O_{25}:Eu^{2+}$ (SAE) and a second phosphor having the formula $(Tb_{1-x-y}A_xRE_y)_3D_zO_{12}$, where A is a member selected from the group consisting of Y, La, Gd, and Sm; RE is a member selected from the group consisting of Ce, Pr, Nd, Sm, Eu, Gd, Dy, Ho, Er, Tm, Yb, and Lu; D is a member selected from the group consisting of Al, Ga, and In; x is in the range from 0 to about 0.5, y is in the range from about 0 to about 0.2, and z is in the range from about 4 to about 5. Both embodiments produce light having the coordinates x=0.240–0.260 and y=0.340–0.360 on the CIE chromaticity diagram.

11 Claims, 10 Drawing Sheets

WHITE LIGHT LED DEVICE

BACKGROUND OF THE INVENTION

The present invention relates to a visible light emitting device comprising an LED or laser diode and a phosphor. More particularly, the present invention relates to a white light emitting device comprising a near UV/blue LED chip or laser diode and one or more near UV/blue excitable phosphors.

Light emitting diodes (LEDs) are semiconductor light emitters often used as a replacement for other light sources, such as incandescent lamps. They are particularly useful as display lights, warning lights and indicating lights or in other applications where colored light is desired. The color of light produce by an LED is dependent on the type of semiconducting material used in its manufacture.

Colored semiconductor light emitting devices, including light emitting diodes and lasers (both are generally referred to herein as LEDs), have been produced from Group III-V alloys such as gallium nitride (GaN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum. Until quite recently, LEDs have not been suitable for lighting uses where a bright white light is needed, due to the inherent color of the light produced by the LED.

LEDs rely on its semiconductor to emit light. The light is emitted as a result of electronic excitation of the semiconductor material. As radiation (energy) strikes atoms of the semiconductor material, an electron of an atom is excited and jumps to an excited (higher) energy state. The higher and lower energy states in semiconductor light emitters are characterized as the conduction band and the valence band, respectively. The electron, as it returns to its ground energy state, emits a photon. The photon corresponds to an energy difference between the excited state and ground energy state, and results in an emission of radiation.

Recently, techniques have been developed for converting the light emitted from LEDs to useful light for illumination purposes. In one technique, the LED is coated or covered with a phosphor layer. By interposing a phosphor excited by the radiation generated by the LED, light of a different wavelength, e.g., in the visible range of the spectrum may be generated. Often, a combination of LED generated light and phosphor generated light may be used to produce the visible light (e.g. white). The most popular white LEDs consist of blue emitting GaInN chips. The blue emitting chips are coated with a phosphor that converts some of the blue radiation to a complimentary color, e.g. a yellow-green emission. Together, the blue and yellow-green radiation produces a white light. There are also white LEDs that utilize a UV emitting chip and phosphors designed to convert the UV radiation to visible light. Typically, two or more phosphors are required to produce the white light. Known phosphors for use with LEDs in producing white light include cerium doped yttrium aluminum garnet $Y_3Al_5O_2:Ce^{3+}$ ("YAG:Ce") as well as $Tb_3Al_{4.9}O_{12}:Ce$ ("TAG:Ce").

There are different "whites", "warm whites" and "cold whites" being the most common description. Scientifically, all chromaticies corresponding to black body spectra making up the Planckian locus are "whites". A color near to this locus, a "white" is characterized by a deviation from the coordinates lying on the Planckian locus on the CIE chromaticity diagram and is perceived as a slight coloration called a tint. In standards like the automobile industries SAE J578, the maximum tint permitting the designation "white" is specified.

Although known LED-phosphor combinations can be effective, the nature of such devices limits them to emitting only one shade of "white". That is, each specific phosphor and LED combination will produce a different "white" emission. Each phosphor will have a certain specific emission spectrum. Likewise, a certain LED semiconductor chip will have a unique emission spectrum. These emissions can be plotted as x and y coordinates on the CIE chromaticity diagram. Only colors on the line connecting the two points can be produced by the LED/phosphor combination. Thus, such a combination will be limited to producing only a single white. As standardized in SAE J578, however, the automobile industry defines the "white" emission region as encompassing a range of "whites" having slightly different emission spectra. Known phosphor/LED combinations cannot produce all "whites" within this region. Thus, it would be advantageous to produce a phosphor coated LED having a "white" color not producible using known phosphor and LED combinations.

SUMMARY OF THE INVENTION

In one aspect, the present invention provides a light emitting device emitting light having a color with the coordinates ccx:0.253 and ccy:0.348 on the CIE chromaticity diagram comprising a blue LED emitting at 460–470 nm and a phosphor $Ca_8Mg(SiO_4)_4Cl_2:Eu^{2+},Mn^{2+}$.

In another aspect, the present invention provides a light emitting device emitting light having the coordinates x:0.253 and y:0.348 on the CIE chromaticity diagram comprising a near UV/blue LED emitting at 430 nm and a combination of the phosphors $Tb_3Al_{4.9}O_{12}:Ce$ ("TAG:Ce") and $Sr_4Al_{14}O_{25}:Eu^{2+}$ (SAE).

In a third aspect, a method for forming a lighting apparatus is provided, the method including the steps of providing a blue LED capable of emitting radiation having a wavelength of about 430 nm, radiationally coupling a phosphor comprising $Ca_8Mg(SiO_4)_4Cl_2:Eu^{2+},Mn^{2+}$ to the semiconductor light source, wherein the phosphor is capable of absorbing the radiation emitted by the semiconductor light source and converting the radiation into white light having the coordinates wherein x is in the range 0.240–0.260 and y is in the range 0.340–0.360 on the CIE chromaticity diagram.

In a fourth aspect, a method for forming a lighting apparatus is provided, the method including the steps of providing a blue LED capable of emitting radiation having a wavelength of from about 460 to about 470 nm, radiationally coupling a phosphor blend comprising $Sr_4Al_{14}O_{25}:Eu^{2+}$ (SAE) and a second phosphor having the formula $(Tb_{1-x-y}A_xRE_y)_3D_zO_{12}$ (TAG), where A is a member selected from the group consisting of Y, La, Gd, and Sm; RE is a member selected from the group consisting of Ce, Pr, Nd, Sm, Eu, Gd, Dy, Ho, Er, Tm, Yb, and Lu; D is a member selected from the group consisting of Al, Ga, and In; x is in the range from 0 to about 0.5, y is in the range from about 0 to about 0.2, and z is in the range from about 4 to about 5, to the semiconductor light source, wherein the phosphor is capable of absorbing the radiation emitted by the semiconductor light source and converting the radiation into white light having the coordinates wherein x is in the range 0.240–0.260 and y is in the range 0.340–0.360 on the CIE chromaticity diagram.

DETAILED DESCRIPTION OF THE INVENTION

Figure 1:
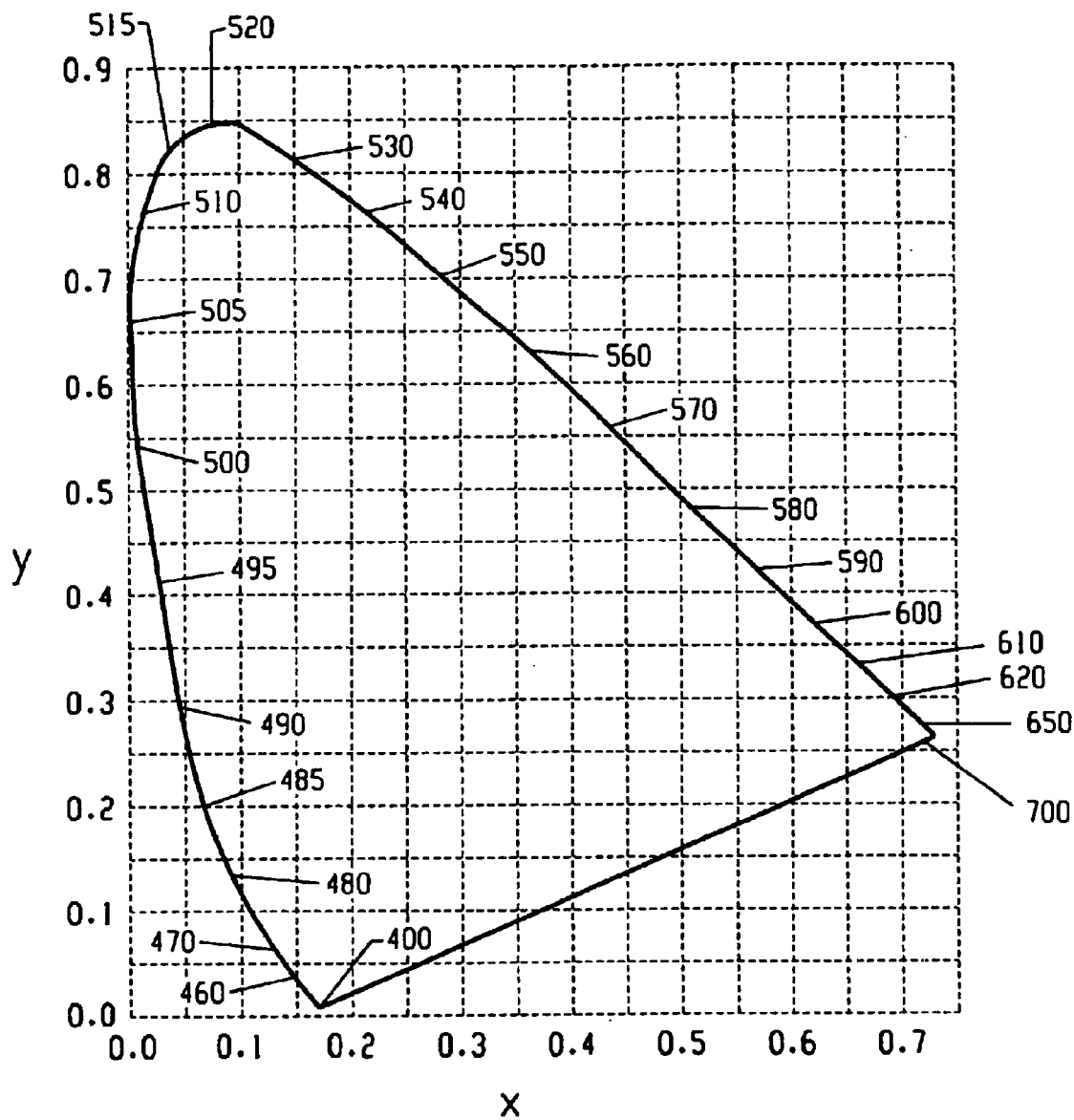
FIG. 1 is a depiction of the CIE chromaticity diagram.
Figure 2:
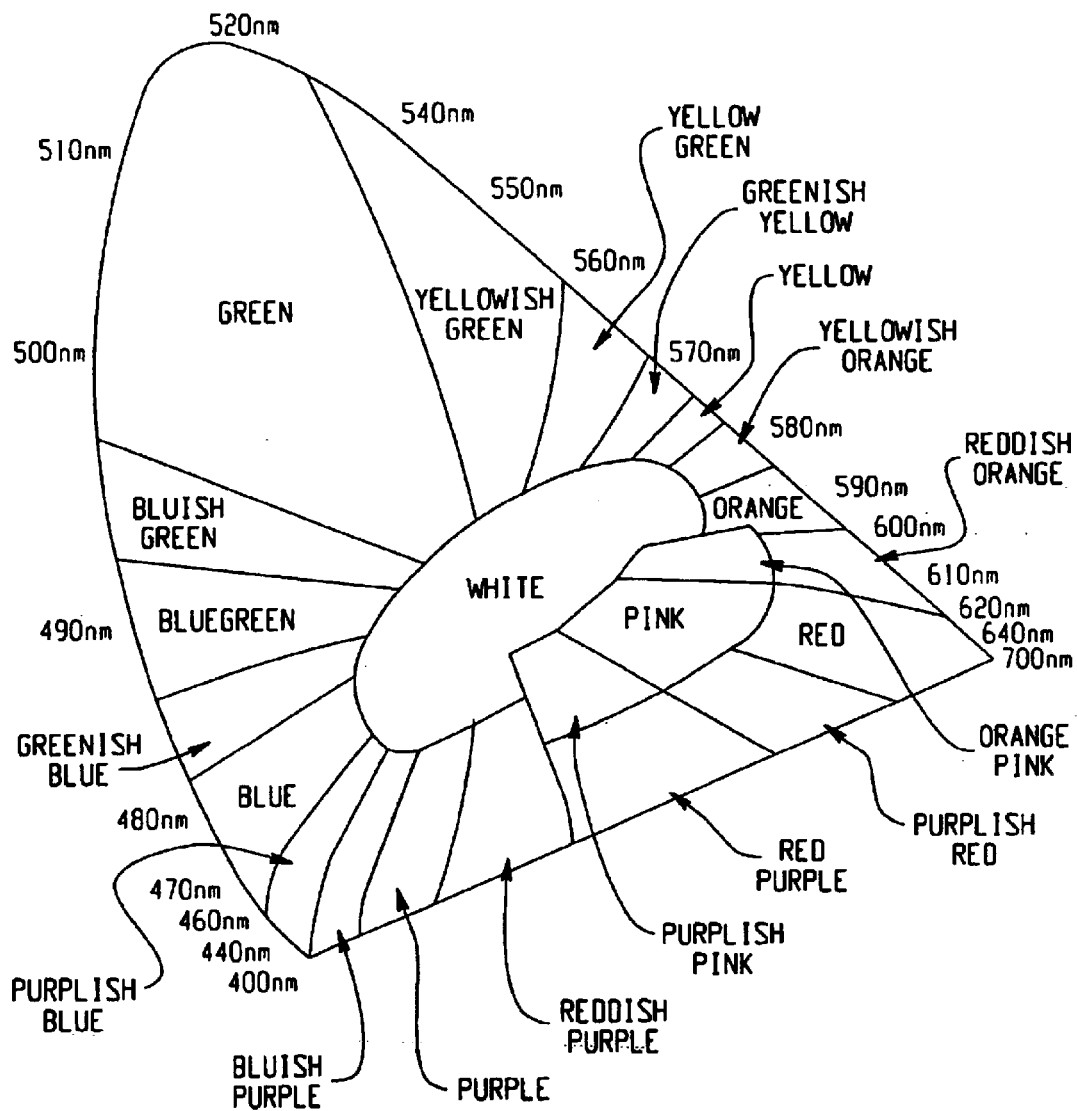
FIG. 2 is a depiction of the CIE chromaticity diagram showing the approximate location of various colors.

With reference to FIG. 1, a standard CIE (Commission International de I'Eclairage) chromaticity diagram is shown mapping out the human color perception in terms of two CIE parameters x and y. For a technical description of the CIE chromaticity diagram, see, for example, "Encyclopedia of Physical Science and Technology", vol. 7, 230–231 (Robert A Meyers ed., 1987). The spectral colors are distributed around the edge of the outlined space, which includes all of the hues perceived by the human eye. The boundary line represents maximum saturation for the spectral colors. In FIG. 2, approximate colors are shown in the diagram, with the corresponding emission wavelength.

Figure 3:
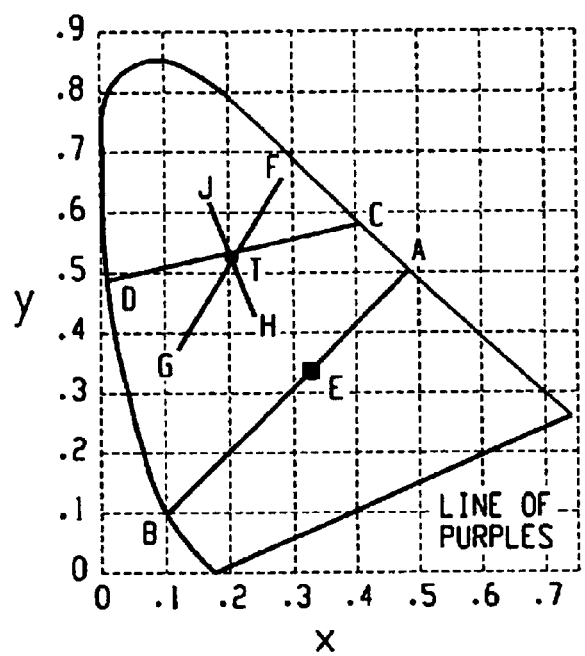
FIG. 3 is a depiction of the CIE chromaticity diagram showing the colors obtainable from the combination of two emissions.

It has been found that many different combinations of light wavelengths can produce the same perception of color. Thus, as shown in FIG. 3, the pairs CD, FG and JH can each produce the color T if combined in the correct proportions. However, as described above, combining the emissions of an LED emitting at C with a phosphor emitting at D, for example, can only produce an emission with colors along the line CD, depending on the relative intensities of each emission. No other colors on the chromaticity diagram can be produced by the specific LED/phosphor combination however.

In the automotive industry, a need has arisen among certain OEM's for an LED-phosphor based light having an emission spectrum with the CIE color coordinates wherein x is in the range 0.240–0.260 and y is in the range 0.340–0.360. This corresponds to a light having a "milky white" color. Such a color cannot be obtained by using a blue or UV chip with the known phosphors YAG:Ce or TAG:Ce or other known LED/phosphor combinations.

Figure 4:
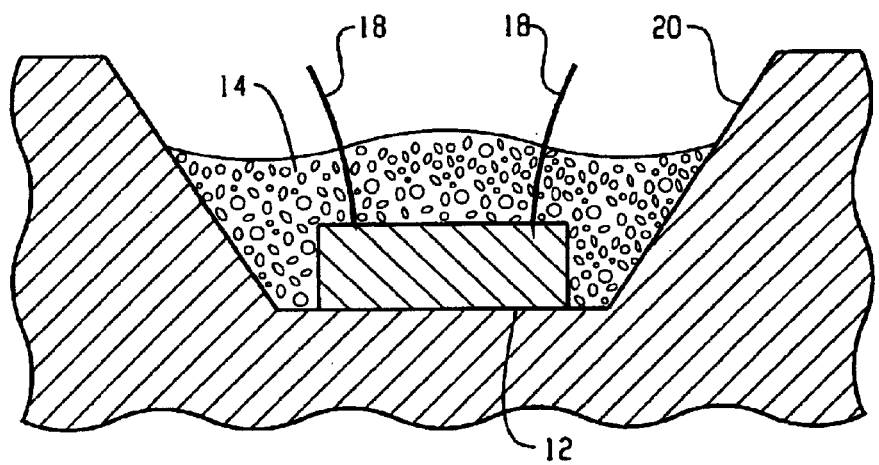
FIG. 4 is a schematic cross-sectional view of a light emitting diode device according to an embodiment of the present invention.
Figure 5:
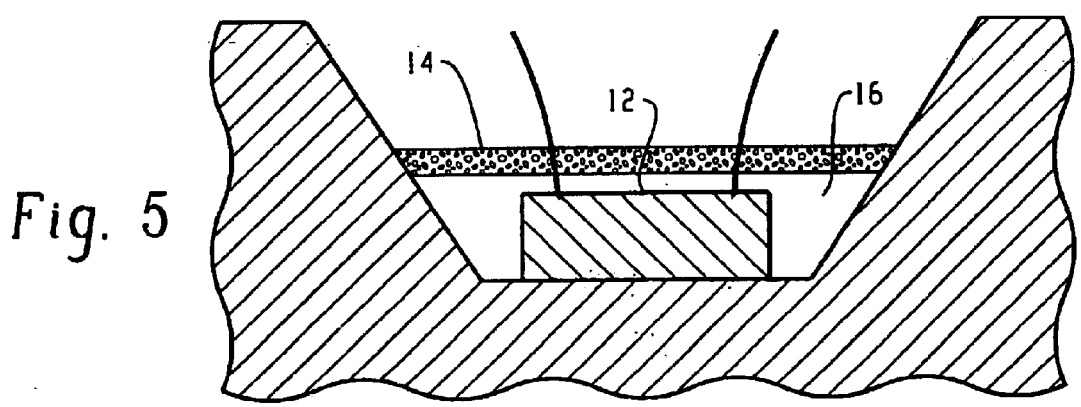
FIG. 5 is a schematic cross-sectional view of a light emitting diode device according to another embodiment of the present invention.

FIG. 4 illustrates an exemplary light emitting assembly 10, in accordance with one embodiment of the invention. The light emitting assembly 10 comprises a semiconductor UV/blue radiation source, such as a InGaN LED 12, and a phosphor conversion material blend 14. The phosphor conversion material blend may comprise a single phosphor or a blend of phosphors. The phosphor conversion material blend 14 is radiationally coupled to the LED 12 to receive radiation from the LED 12. Radiationally coupled means that the elements are associated with each other so radiation from one is transmitted to the other. The phosphor conversion material blend 14 is deposited on the LED 12 by any appropriate method. For example, a water based suspension of the phosphor(s) can be formed, and applied to a LED surface. In one such method, a silicone slurry in which the phosphor particles are randomly embedded is placed around the LED. This method is merely exemplary of possible positions of the phosphor conversion material blend 14 and LED 12. Alternatively, as shown in FIG. 5, the phosphor conversion material blend 14 can be coated on or embedded in a cover, lens or other optical feature associated with the LED 12 to absorb and convert energy as long as the phosphor conversion material blend 14 is radiationally coupled to the LED 12. In this arrangement, there is a space 16 between the LED and the phosphor. Such space 16 can be either a vacuum or filled with a transparent gas or solid.

The LED can be mounted in a reflective cup 20. The cup may be made from or coated with a reflective material, such as alumina, titania, or other dielectric powder known in the art. A preferred reflective material is $Al_2O_3$. A pair of electrodes 18 connect the LED to an electric power source (not shown).

The LED 12 comprises a semiconductor doped with various impurities. The LED may comprise a nitride compound semiconductor represented by the formula $In_iGa_jAl_kN$ (where $0 \leq i$; $0 \leq j$; $0 \leq K$ and $i+j+k=1$). Such LED semiconductors are known in the art. The radiation source is described as an LED for convenience. However, as used herein, the term is meant to encompass all semiconductor radiation sources including semiconductor laser diodes. In one embodiment of the invention, the emission spectrum of the LED will be from about 460–470 nm, corresponding to a blue color. In another embodiment of the invention, the LED will have its, peak emission at about 430 nm, corresponding to a deep blue color. These LEDs are then combined with the appropriate phosphor blend 12 to produce a white light with the color approximate coordinates wherein x is in the range 0.240–0.260 and y is in the range 0.340–0.360, and more specifically x=0.253; y=0.348 on the CIE chromaticity diagram.

The phosphor conversion material blend may comprise a single phosphor or a blend of phosphors, depending on the LED used, above. When the 460–470 nm LED is used, the phosphor conversion material blend comprises the single phosphor $Ca_8Mg(SiO_4)_4Cl_2:Eu^{2+}Mn^{2+}$ ("CASI"). This phosphor is disclosed in detail in U.S. Pat. No. 6,294,800, the disclosure of which is incorporated herein in its entirety.

Figure 6:
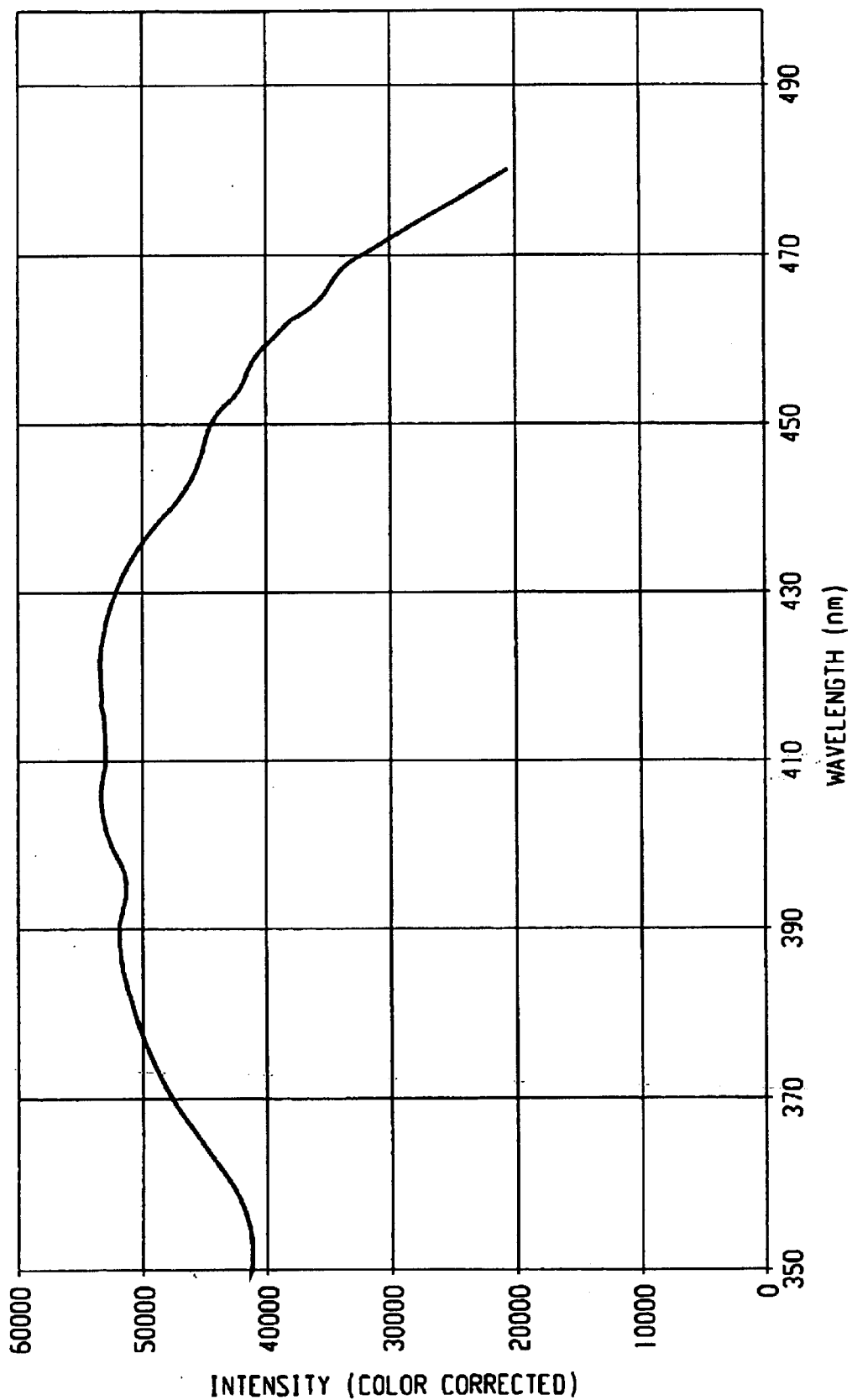
FIG. 6 is a graph showing the excitation spectrum of the phosphor $Ca_8Mg(SiO_4)_4Cl_2:Eu^{2+},Mn^{2+}$ used in an embodiment of the present invention.
Figure 7:
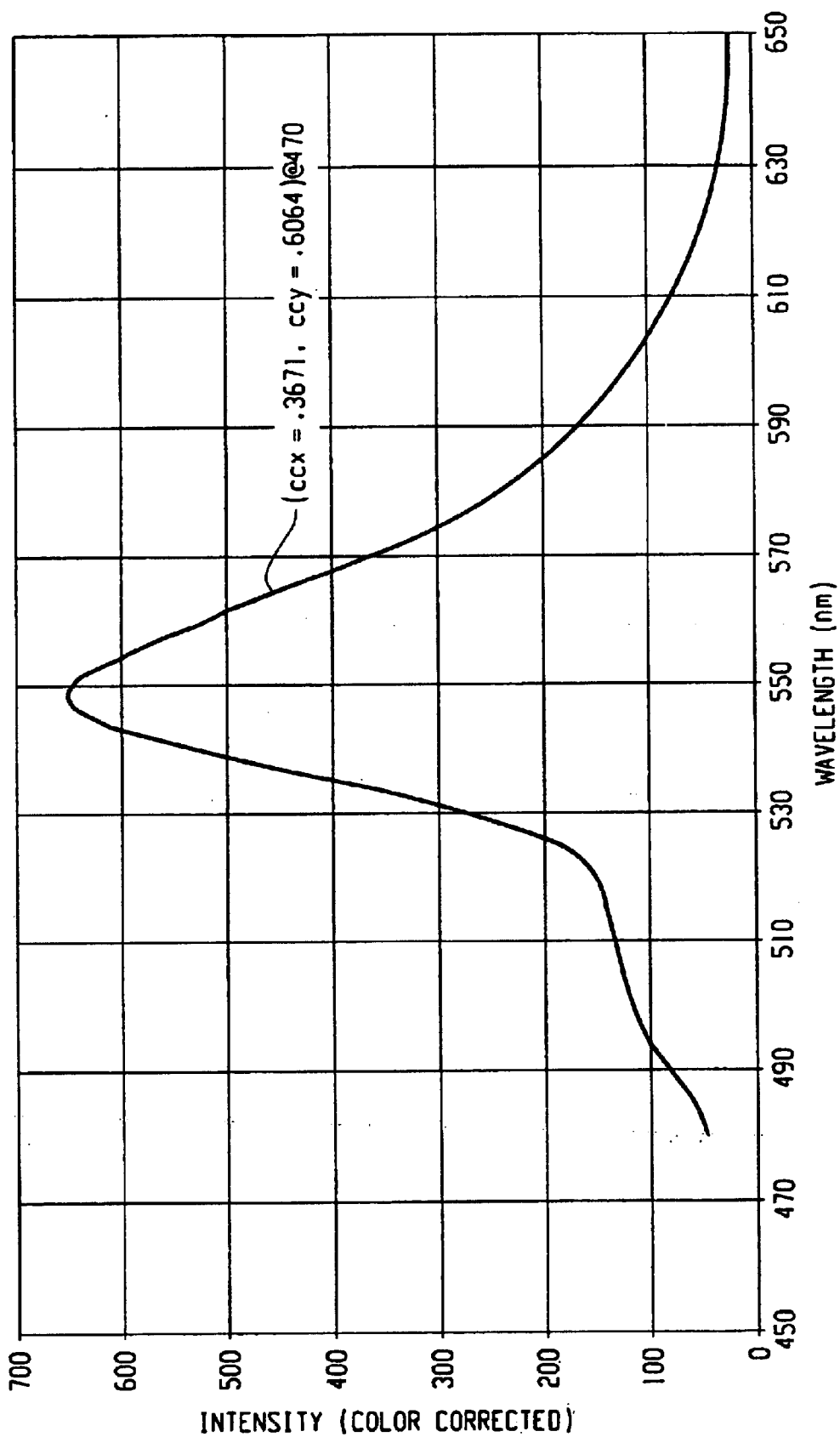
FIG. 7 is a graph showing the emission spectrum of the phosphor $Ca_8Mg(SiO_4)_4Cl_2:Eu^{2+},Mn^{2+}$ used in an embodiment of the present invention.
Figure 8:
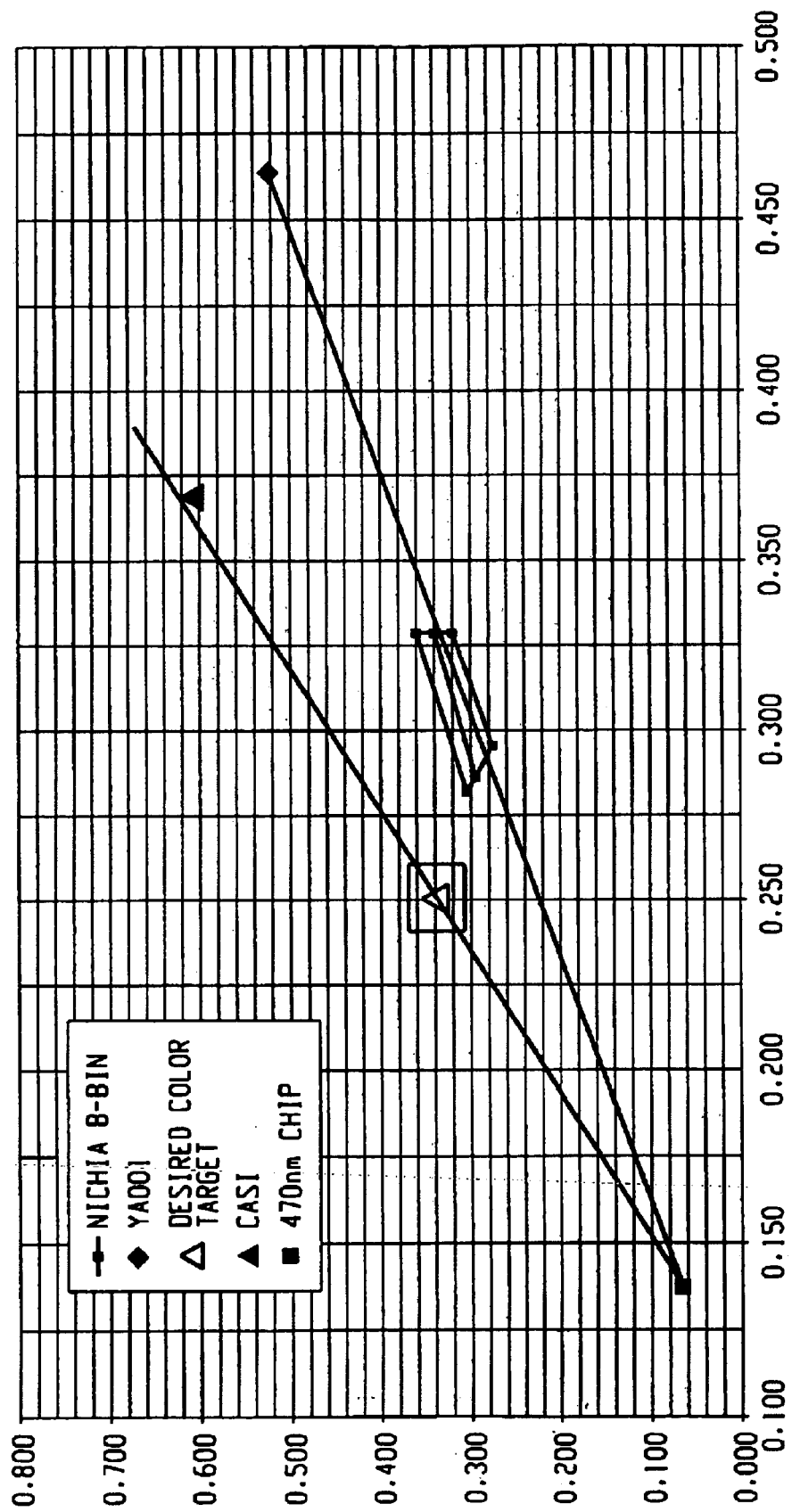
FIG. 8 is a graph showing the color coordinates of the possible emissions using various phosphors with a 470 nm LED chip and an OEM target color.

FIG. 6 is an illustration of a graph of absorption by $Ca_8Mg(SiO_4)_4Cl_2:Eu^{2+}Mn^{2+}$. FIG. 7 is an illustration of the emission of $Ca_8Mg(SiO_4)_4Cl_2:Eu^{2+}Mn^{2+}$, where the emission is centered around 540 nm, and exhibits a clear high quality green light. The CASI phosphor shown strong absorption at the 460–470 nm range of the LED. As shown in FIG. 8, the resultant LED assembly produces a milky white light having an emission coordinates on the CIE diagram that are not obtainable using known LED-phosphor combinations with a 460–470 nm chip. As seen in FIG. 8, both conventional TAG:Ce (designated YA 001) and a white emitting phosphor recently developed by Nichia Corp. (designated Nichia B-Bin) are incapable of producing such a white light.

In another embodiment, where an LED having an emission centered at around 430 nm is used, the phosphor conversion material blend 12 comprises a blend of $Sr_4Al_{14}O_{25}:Eu^{2+}$ (SAE) and a second phosphor having the general formula $(Tb_{1-x-y}A_xRE_y)_3D_zO_{12}$, where A is a member selected from the group consisting of Y, La, Gd, and Sm; RE is a member selected from the group consisting of Ce, Pr, Nd, Sm, Eu, Gd, Dy, Ho, Er, Tm, Yb, and Lu; D is a member selected from the group consisting of Al, Ga, and In; x is in the range from 0 to about 0.5, preferably from 0 to about 0.3, more preferably from 0 to about 0.2; and y is in the range from about 0.00 to about 0.2, preferably from about 0.005 to about 0.1, more preferably from about 0.005 to about 0.07; and z is in the range from about 4 to about 5, preferably from about 4.5 to 5, more preferably from about 4.6 to less than about 5. $(Tb_{1-x-y}A_xRE_y)_3D_zO_{12}$ is described in commonly assigned co-pending application Ser. No. 09/681,522, filed on Jun. 1, 2001, the disclosure of which is incorporated herein by reference. SAE is a commercially available phosphor. In one preferred embodiment, the second phosphor is terbium aluminum garnet activated with cerium having the formula $(Tb_{1-y}Ce_y)_aAl_{4.9}O_{12}$ (TAG:Ce) where y takes the values as defined above and a is in the range from about 2.8 to 3. Thus, a preferred phosphor conversion material blend comprises a blend of SAE and $Tb_3Al_{4.9}O_{12}:Ce$.

The TAG phosphor for use in the phosphor blend of the present invention may be produced by a method comprising the steps of: (1) providing stoichiometric amounts of oxygen-containing compounds of terbium; oxygen-containing compounds of at least one rare-earth metal selected from the group consisting of Ce, Pr, Nd, Sm, Eu, Gd, Dy, Ho, Er, Tm, Yb, and Lu; and oxygen-containing compounds of at least one member selected from the group consisting of Al, Ga, and In; (2) mixing together the oxygen-containing compounds to form a mixture; and (3) firing the mixture in a reducing atmosphere at a temperature and for a time sufficient to convert the mixture to a rare earth-activated terbium-containing garnet phosphor.

An amount of fluoride of at least one metal selected from the group consisting of terbium, aluminum, gallium, and indium may be added as a fluxing agent into the mixture of the oxygen-containing compounds before or during the step of mixing. A quantity of a fluoride compound of less than about 20, preferably less than about 10, percent by weight of the total weight of the mixture is adequate for fluxing purposes.

The oxygen-containing compounds may be mixed together by any mechanical method including, but not limited to, stirring or blending in a high-speed blender or a ribbon blender. The oxygen-containing compounds may be combined and pulverized together in a bowl mill, a hammer mill, or a jet mill. The mixing may be carried out by wet milling especially when the mixture of the oxygen-containing compounds is to be made into a solution for subsequent precipitation. If the mixture is wet, it may be dried first before being fired under a reducing atmosphere at a temperature from about 900° C. to about 1700° C., preferably from about 1000° C. to about 1600° C., more preferably from about 1200° C. to about 1500° C. for a time sufficient to convert all of the mixture to the final garnet composition. The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate. The reducing atmosphere typically comprises a reducing gas such as hydrogen, carbon monoxide, or a combination thereof, optionally diluted with an inert gas, such as nitrogen, helium, neon, argon, krypton, xenon, or a combination thereof. Alternatively, the crucible containing the mixture may be packed in a second closed crucible containing high-purity carbon particles and fired in air so that the carbon particles react with the oxygen present in air, thereby, generating carbon monoxide that is needed to provide the reducing atmosphere.

One or more of the starting materials for the phosphor synthesis may be oxygen-containing compounds other than oxides, such as nitrates, sulfates, acetates, citrates, or chlorates. For example, amounts of $Tb_4O_7$, $Al(NO_3)_3.9H_2O$, $Ce(NO_3)_3.6H_2O$ and $AlF_3$ may be blended and dissolved in a nitric acid solution. The strength of the acid solution is chosen to rapidly dissolve the oxygen-containing compounds and the choice is within the skill of a person skilled in the art. Ammonium hydroxide is then added in increments to the acidic solution containing Tb, Ce, and Al while stirring to precipitate a mixture of hydroxides of Tb, Ce, and Al. An organic base such as methanolamine, ethanolamine, propanolamine, dimethanolamine, diethanolamine, dipropanolamine, trimethanolamine, triethanolamine, or tripropanolamine may be used in place of ammonium hydroxide. The precipitate is filtered, washed with deionized water, and dried. The dried precipitate is ball milled or otherwise thoroughly blended and then calcined in air at about 400° C. to about 1600° C. for a sufficient time to ensure a substantially complete dehydration of the starting material. The calcination may be carried out at a constant temperature. Alternatively, the calcination temperature may be ramped from ambient to and held at the final temperature for the duration of the calcination. The calcined material is similarly fired at 1200–1600° C. for a sufficient time under a reducing atmosphere such as $H_2$, CO, or a mixture of one of theses gases with an inert gas, or an atmosphere generated by a reaction between a coconut charcoal and the products of the decomposition of the oxygen-containing compounds to covert all of the calcined material to the desired phosphor composition.

Figure 9:
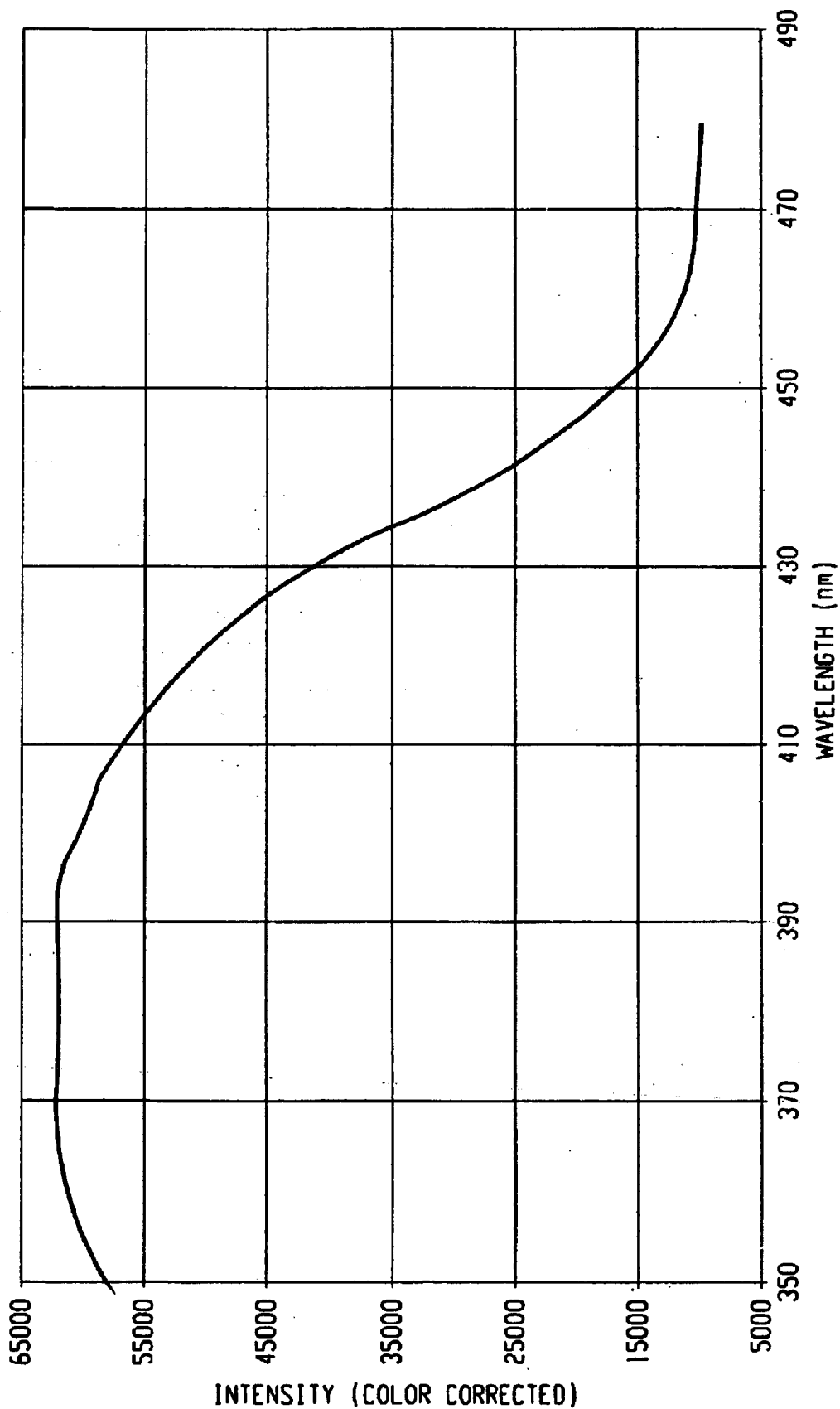
FIG. 9 graph showing the excitation spectrum of a combination of the phosphors $Tb_3Al_{4.9}O_{12}:Ce$ ("TAG:Ce") and $Sr_4Al_{14}O_{25}:Eu^{2+}$ (SAE) used in another embodiment of the present invention.
Figure 10:
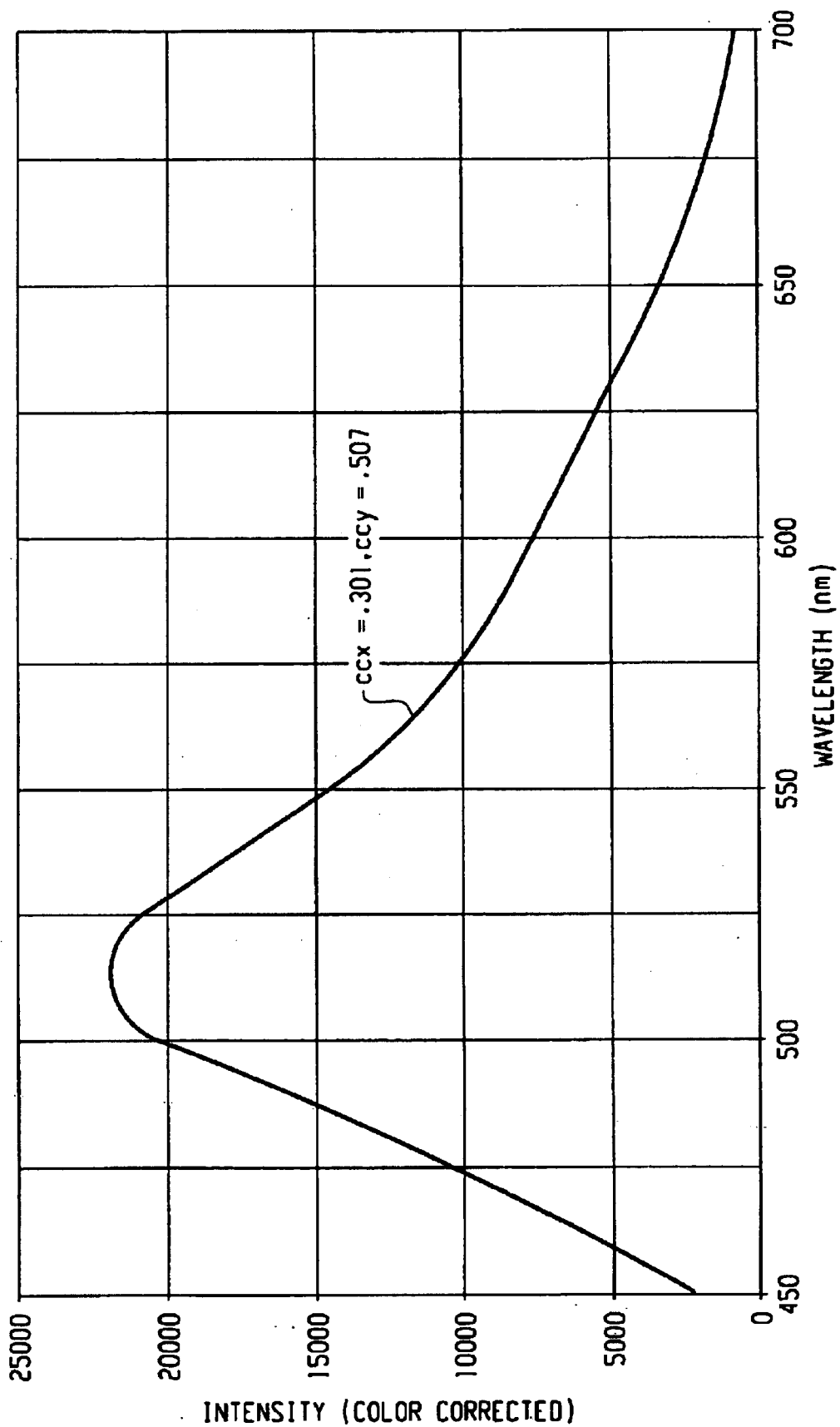
FIG. 10 graph showing the emission spectrum of the combination of the phosphors $Tb_3Al_{4.9}O_{12}:Ce$ ("TAG:Ce") and $Sr_4Al_{14}O_{25}:Eu^{2+}$ (SAE) used in another embodiment of the present invention
Figure 11:
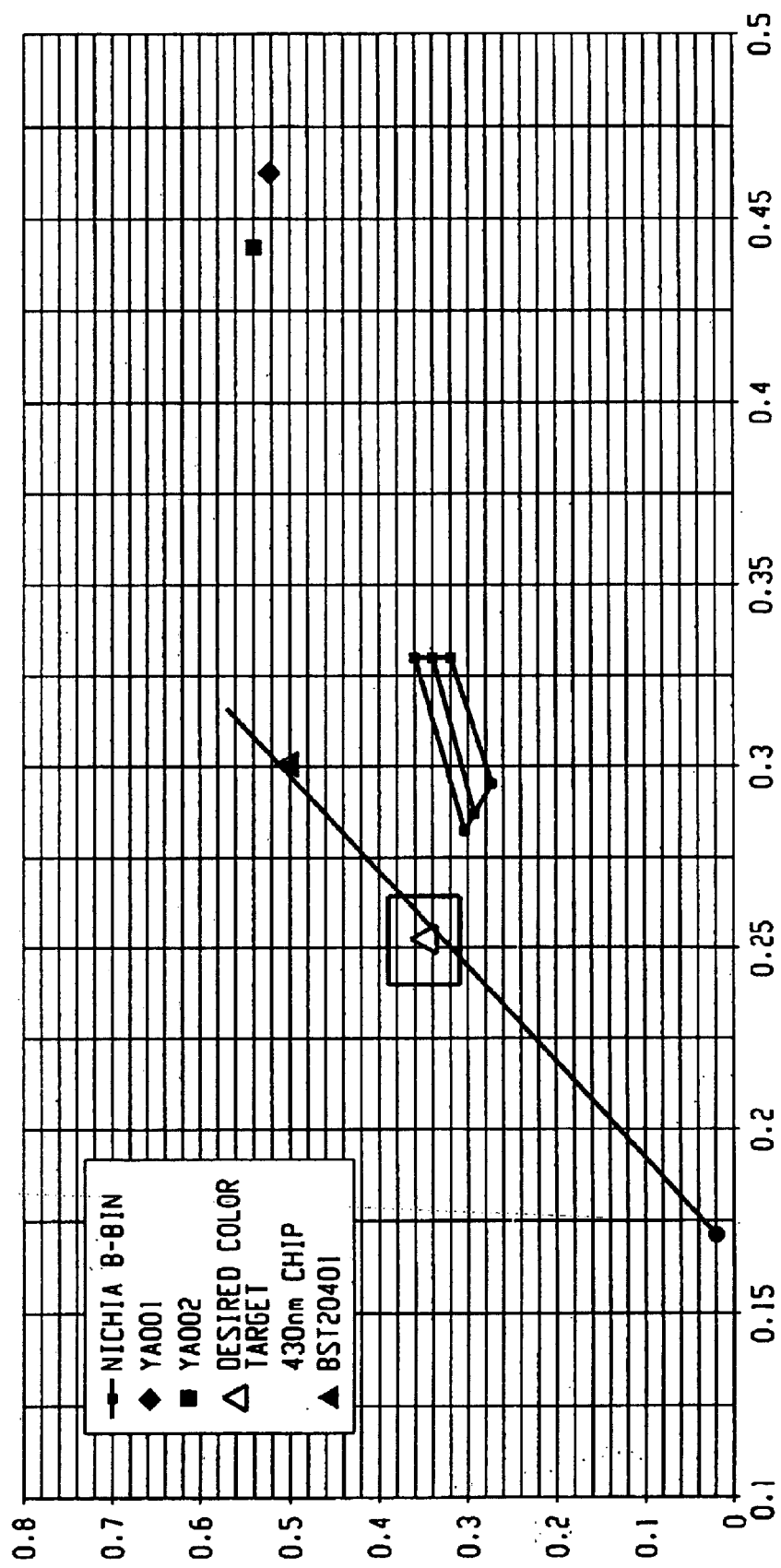
FIG. 11 is a graph showing the color coordinates of the possible emissions using various phosphors with a 430 nm LED chip and an OEM target color.

FIG. 9 is an illustration of a graph of absorption by a mixture of SAE and TAG:Ce. FIG. 10 is an, illustration of the emission of SAE and TAG:Ce, where the emission is centered around 530 nm, and exhibits a clear high quality green light. The SAE/TAG:Ce phosphor mixture shown strong absorption in the near UV/Blue spectrum. As shown in FIG. 11, when such a phosphor combination (designated BST20401) is radiationally coupled to an LED chip emitting in the 430 nm range, the resultant LED assembly produces a milky white light having an emission coordinates, on the CIE diagram that are not obtainable using known YAG:Ce or TAG:Ce phosphor combinations (designated YA001, YA002 and Nichia B-Bin) with a 430 nm chip.

Figure 13:
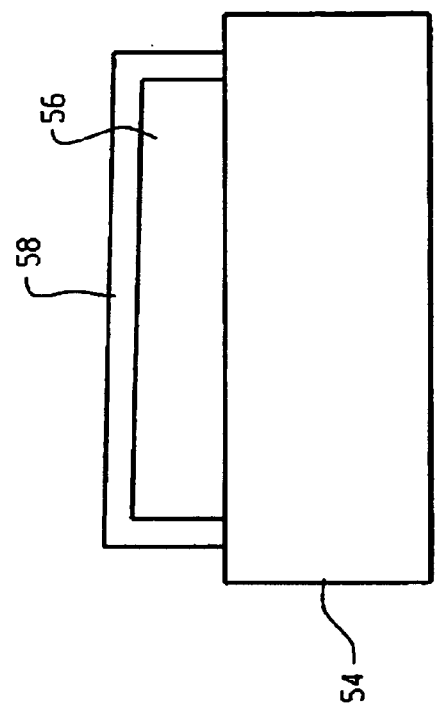
FIG. 13 is a detailed depiction of an LED for use in the embodiment of FIG. 12.
Figure 12:
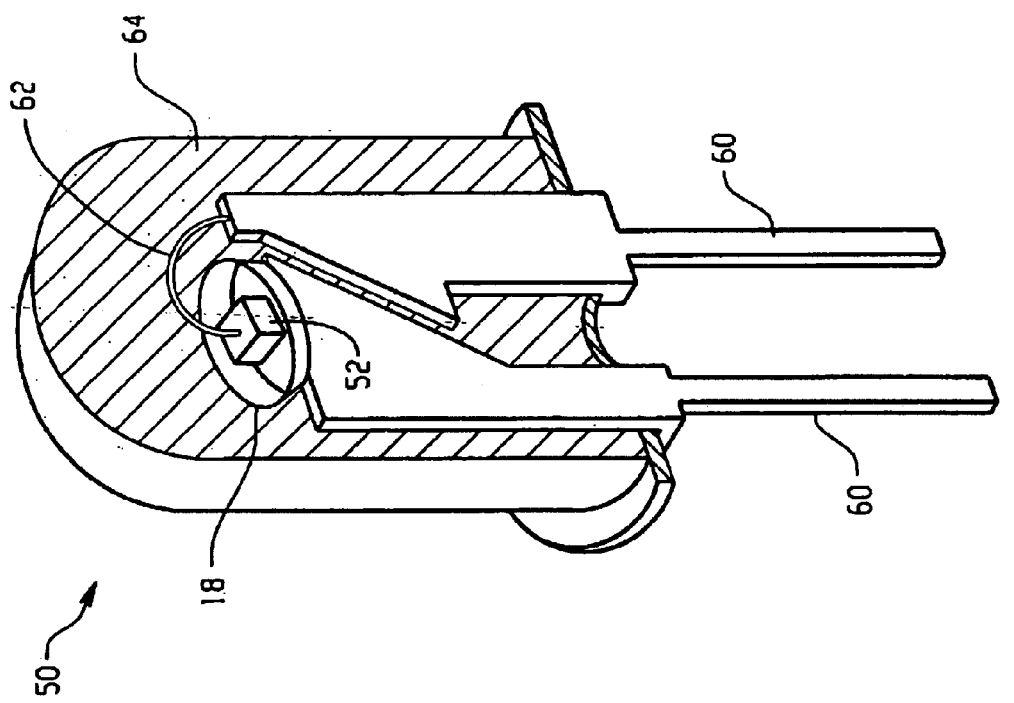
FIG. 12 is a schematic cross-sectional view of a light emitting diode device according to another embodiment of the present invention.

As shown in FIG. 12, an exemplary embodiment of a white-light emitting LED lamp incorporating the present invention is provided at 50. The lamp 50 includes an LED chip or die 52. As more clearly seen in FIG. 13, the LED chip includes a substrate 54 upon which a stack 56 of semiconductor and/or other LED forming materials are layered. A phosphor layer 58 is then positioned on top of the LED chip 56. The chip 56 may be any type of conventional LED die known in the art. Preferably, the chip 56 is a gallium nitride-based LED, e.g., a gallium nitride (GaN) LED, an aluminum gallium nitride (AlGaN) LED, an indium gallium nitride (InGaN) LED, an aluminum indium gallium nitride (AlInGaN) LED, or the like. Preferably, the substrate 54 is a sapphire, alumina, or other appropriate substrate material as is known in the art, be it transparent, opaque, reflective or otherwise. Additionally, the substrate 54 may be electrically conductive or electrically insulating. In one alternate embodiment, the substrate 54 is removed or omitted altogether.

The light source 50 includes a pair of electrodes 60, which operatively connect the LED 52 to an electric power source (not shown). A conducting wire 62 may electrically connect the die with one of the electrodes. A reflector cup 64 may be used to direct emitted light outward. Accordingly, the LED 52 may be selectively energized to produce light by selectively applying electricity to the die. Optionally, when an electrically conductive substrate 54 is employed, the substrate 54 may act as one of the electrodes 60 or otherwise have one of the electrodes 60 connected thereto (as shown in FIG. 12). The produced light may be of any desired wavelength or wavelengths depending upon the type of LED chip 56 employed. In the preferred embodiments, as discussed above, the light is in the blue to ultraviolet wavelength range. In any event, the substrate 54 and encapsulant 64 (described below) are both preferably transparent or substantially optically transmissive with respect to the wavelength of light produced by the chip 56.

The LED 52 is preferably encapsulated in an encapsulant 64. Preferably, the LED 52 is substantially centered in the encapsulant 64. The encapsulant 64 is preferably an epoxy, plastic, low temperature glass, polymer, thermoplastic, thermoset material, resin or other type of LED encapsulating material as is known in the art. Optionally, the encapsulant 64 is a spin-on glass or some other high index of refraction material. Also, instead of being deposited directly on the LED 52, the phosphor is optionally dispersed in and/or coated on the encapsulant 64. Depending on the type employed, the phosphor emits light of a desired wavelength when excited, e.g., with light produced by the LED 52. In this manner, the LED device 50 can be made to emit light of a desired wavelength or wavelengths even though the LED chip 56 employed produces light of another wavelength or wavelengths. Preferably, the LED device 50 is made to emit a spectrum of light which is white or nearly white and having the coordinates wherein x is in the range 0.240–0.260 and y is in the range 0.340–0.360 on the CIE chromaticity diagram.

The invention has been described with reference to various preferred embodiments. Obviously, modifications and alteration will occur to others upon a reading and understanding of this specification. The invention is intended to include all such modifications and alterations insofar as they come within the scope of the appended claims or the equivalent thereof.

What is claimed is:

1. A lighting apparatus comprising:
   a semiconductor light source emitting radiation having a wavelength in the range of about 430 nm;
   a phosphor blend comprising $Sr_4Al_{14}O_{25}:Eu^{2+}$ (SAE) and a second phosphor having the formula $(Tb_{1-x-y}A_xRE_y)_3D_zO_{12}$, where A is a member selected from the group consisting of Y, La, Gd, and Sm; RE is a member selected from the group consisting of Ce, Pr, Nd, Sm, Eu, Gd, Dy, Ho, Er, Tm, Yb, and Lu; D is a member selected from the group consisting of Al, Ga, and In; x is in the range from 0 to about 0.5, y is in the range from about 0 to about 0.2, and z is in the range from about 4 to about 5; the phosphor blend radiationally coupled to the semiconductor light source;
   wherein the phosphor is capable of absorbing the radiation emitted by the semiconductor light source and converting the radiation into white light.

2. The lighting apparatus of claim 1, wherein x is from about 0 to about 0 2.

3. The lighting apparatus of claim 1, wherein z is from about 4.6 to about 5.

4. The lighting apparatus of claim 1, wherein the second phosphor has the formula $Tb_3Al_{4.9}O_{12}:Ce$.

5. The lighting apparatus of claim 1, wherein the white light has coordinates on the CIE chromaticity diagram wherein x is in the range 0.240–0.260 and y is in the range 0.340–0.360.

6. The lighting apparatus of claim 1, the semiconductor light source is a light emitting diode (LED).

7. The lighting apparatus of claim 6, wherein the LED comprises a nitride compound semiconductor represented by the formula $In_iGa_jAl_kN$, where $0 \leq i$; $0 \leq j$, $0 \leq K$, and $i+j+k=1$.

8. The lighting apparatus of claim 1, wherein the phosphor is coated on the surface of the semiconductor light source.

9. The lighting apparatus of claim 1, further comprising an encapsulant surrounding the semiconductor light source and the phosphor.

10. The lighting apparatus of claim 1, further comprising a reflector cup.

11. Method for forming a lighting apparatus, the method comprising the steps of:
   providing a blue LED capable of emitting radiation having a wavelength of from about 460 to about 470 nm;
   radiationally coupling a phosphor blend comprising $Sr_4Al1_4O_{25}:Eu^{2+}$ (SAE) and a second phosphor having the formula $(Tb_{1-x-y}A_xRE_y)_3D_zO_{12}$, where A is a member selected from the group consisting of Y, La, Gd, and Sm; RE is a member selected from the group consisting of Ce, Pr, Nd, Sm, Eu, Gd, Dy, Ho, Er, Tm, Yb, and Lu; D is a member selected from the group consisting of Al, Ga, and In; x is in the range from 0 to about 0.5, y is in the range from about 0 to about 0.2, and z is in the range from about 4 to about 5, to the semiconductor light source;
   wherein the phosphor is capable of absorbing the radiation emitted by the semiconductor light source and converting the radiation into white light having coordinates on the CIE chromaticity diagram wherein x is in the range 0.240–0.260 and y is in the range 0.340–0.360.

* * * * *